(12) United States Patent
Ishii et al.

(10) Patent No.: US 6,452,093 B1
(45) Date of Patent: *Sep. 17, 2002

(54) CABLE AND HEAT SINK

(75) Inventors: Shigeru Ishii, Machida (JP); Shigeki Mori, Machida (JP); Hirokazu Nishimura, Yokohama (JP); Shinji Nakai, Yokohama (JP)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/512,791

(22) Filed: Feb. 25, 2000

(30) Foreign Application Priority Data

Feb. 25, 1999 (JP) .............................. 11-047643

(51) Int. Cl.[7] .............................................. H01L 23/26
(52) U.S. Cl. ...................................... 174/16.3; 361/704
(58) Field of Search ........................ 174/16.3, 36, 78; 165/80.2, 80.3; 361/705, 704, 712, 713

(56) References Cited

U.S. PATENT DOCUMENTS

| 5,077,637 | A | * | 12/1991 | Martorana et al. | 361/386 |
| 5,213,750 | A | * | 5/1993 | Knapp et al. | 264/280 |
| 5,390,734 | A | * | 2/1995 | Voorhes et al. | 165/185 |
| 5,726,660 | A | * | 3/1998 | Purdy et al. | 342/357 |
| 5,751,260 | A | * | 5/1998 | Nappi et al. | 345/8 |
| 5,774,338 | A | * | 6/1998 | Wessling, III | 361/730 |
| 5,781,409 | A | | 7/1998 | Mecredy, III | 361/687 |
| 5,781,913 | A | * | 7/1998 | Felsenstein et al. | 707/501 |
| 5,798,907 | A | * | 8/1998 | Janik | 361/683 |
| 5,806,179 | A | * | 9/1998 | Hassanzadeh | 29/860 |
| 5,817,982 | A | * | 10/1998 | Arumufasaamy et al. | 174/120 |
| 5,829,515 | A | * | 11/1998 | Jeffries et al. | 165/80.3 |
| 5,864,465 | A | * | 1/1999 | Liu | 361/697 |
| 5,898,569 | A | * | 4/1999 | Bhatia | 361/700 |
| 6,047,301 | A | * | 4/2000 | Bjorklund et al. | 708/139 |
| 6,052,280 | A | * | 4/2000 | Dilley et al. | 165/104.33 |
| 6,057,966 | A | * | 5/2000 | Carroll et al. | 359/630 |
| 6,097,607 | A | * | 8/2000 | Carroll et al. | 361/752 |
| 6,167,413 | A | * | 12/2000 | Daley, III | 708/139 |
| 6,222,677 | B1 | * | 4/2001 | Budd et al. | 359/630 |

FOREIGN PATENT DOCUMENTS

| EP | 0 782 125 A2 | 12/1996 |
| JP | 4-344716 | 12/1992 |
| JP | 09288913 | 4/1997 |
| JP | 9-288913 | 11/1997 |
| WO | WO98/49879 | 11/1998 |

OTHER PUBLICATIONS

Eurpean Search Report dated Feb. 9, 2001.

Nikkei Electronics (No. 734) Jan. 11, 1999.

* cited by examiner

Primary Examiner—Chau N. Nguyen
Assistant Examiner—William H. Mayo, III
(74) Attorney, Agent, or Firm—Marian Underweiser, Esq.; McGinn & Gibb, PLLC

(57) ABSTRACT

A cable (and heat sink) for radiating heat includes a heat conducting and radiating member for conducting heat in a longitudinal direction of the cable and radiating the conducted heat. The heat sink includes the cable for radiating heat, and a heat connecting member for thermally connecting a heat generator to the cable.

26 Claims, 4 Drawing Sheets

CABLE AND HEAT SINK

BACKGROUND OF THE INVENTION

1. Field of the Invention

The present invention generally relates to a cable for radiating heat. More particularly, it relates to a cable connected to a portable computer that can transmit image signals displayed to users and conduct heat generated inside the portable computer to its exterior for heat radiation.

The present invention also generally relates to a heat sink using the heat-radiating cable, and more particularly, to a heat sink that radiates heat by conducting heat to the cable from a central processing unit (CPU) in a portable computer, which is a heat generator from which heat cannot be radiated easily and to which a radiator cannot be attached easily.

2. Description of the Related Art

Conventional systems such as that of "Nikkei Electronics 11 Jan. pp. 83 to 95 (Document 1; Nikkei BP Co., Ltd., published on Jan. 11, 1999, No. 734)" disclose a small computer that is conveniently portable (e.g., a "wearable computer").

The body of a conventional wearable computer has a small external shape (e.g., 190×63 ×117 mm) and is fixed to a user's belt for operation, for achieving a high level of mathematical performance.

In addition, the wearable computer typically has a display device mounted on a user's head and connected to the body of the wearable computer via a cable and an input device that can be operated with one hand.

As described above, the wearable computer is configured to have a very small body, and it is therefore difficult to attach an external radiator to the wearable computer due to its installation position on the user's body (e.g., clothes).

On the other hand, since high mathematical performance is required of the wearable computer, reducing the amount of heat radiated (e.g., by maintaining a lower clock frequency) is constrained. Thus, it is difficult to achieve a balance in a heat radiation design of a wearable computer.

Japanese Published Unexamined Patent Application No. 09-288913 discloses an example of a heat-radiating device which includes a flat power cable including recesses and projections on its sides to radiate heat away from the cable. This flat cable radiates heat from itself, but cannot be used for an application where heat is allowed to escape to the exterior from a device to which the flat cable is connected.

SUMMARY OF THE INVENTION

In view of the foregoing and other problems, disadvantages, and drawbacks of the conventional wearable computers, the present invention has been devised, and it is an object of the present invention to provide a structure (cable) for conducting heat generated inside a device connected to the cable, to the exterior for cooling purposes.

Another object of the present invention is to provide a heat sink for using a cable connected to a device to conduct heat generated inside this device to the exterior for heat radiation.

Yet another object of the present invention is to provide a cable and heat sink in which a heat conducting member is provided for a cable connecting the body of a portable computer (e.g., a wearable computer) to a display device and in which the cable with the heat conducting member radiates heat from the interior of the portable computer body.

In order to achieve these objects, in a first aspect of the present invention, a cable for radiating heat includes a heat conducting and radiating member for conducting heat in the longitudinal direction of the cable and radiating the conducted heat.

Preferably, the cable includes conductors extending in a longitudinal direction of a cable, and the heat conducting and radiating member extends in a longitudinal direction of the cable and is disposed along the conductors. Further, the conductor is preferably a transmission line that transmits signals or power.

In a second aspect according to the present invention, a cable for radiating heat includes conductors extending in the longitudinal direction of the cable, a heat conducting and radiating member covering the circumference of the conductors to conduct heat in the longitudinal direction of the cable and to radiate the conducted heat, and a coating covering the circumference of the heat conducting and radiating member.

The cable according to the present invention connects the body of a wearable computer and a display device together and conducts heat generated by a CPU internally, to the exterior. Thus, the conducted heat is released externally from a cable surface to remove heat from the interior of the computer body.

Preferably, the heat conducting and radiating member includes a heat conducting sheet wound between signal lines and a coating of the cable that conducts, in the longitudinal direction of the cable, heat generated by the CPU in the computer body, to gradually radiate heat from the surface of the cable.

In addition, a heat sink according to the present invention includes a cable for radiating heat, and a heat connecting member for thermally connecting a heat generator to the cable capable of radiating heat.

A heat sink according to the present invention uses the cable described above in the first and second aspects of the invention to conduct heat generated by the CPU inside the computer body, to the exterior for the purpose of heat radiation.

The heat connecting member preferably includes a heat pipe for thermally connecting the CPU inside the wearable computer and the heat conducting and radiating member (e.g., the above heat conducting sheet) of the cable according to the present invention used as a cable for connection to a display device. The heat connecting member conducts heat generated by the CPU to the heat conducting sheet of the cable in order to radiate heat generated by the CPU to the exterior.

The present disclosure relates to subject matter contained in Japanese Patent Application 11-047643, filed Feb. 25, 1999, which is expressly incorporated herein by reference in its entirety.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
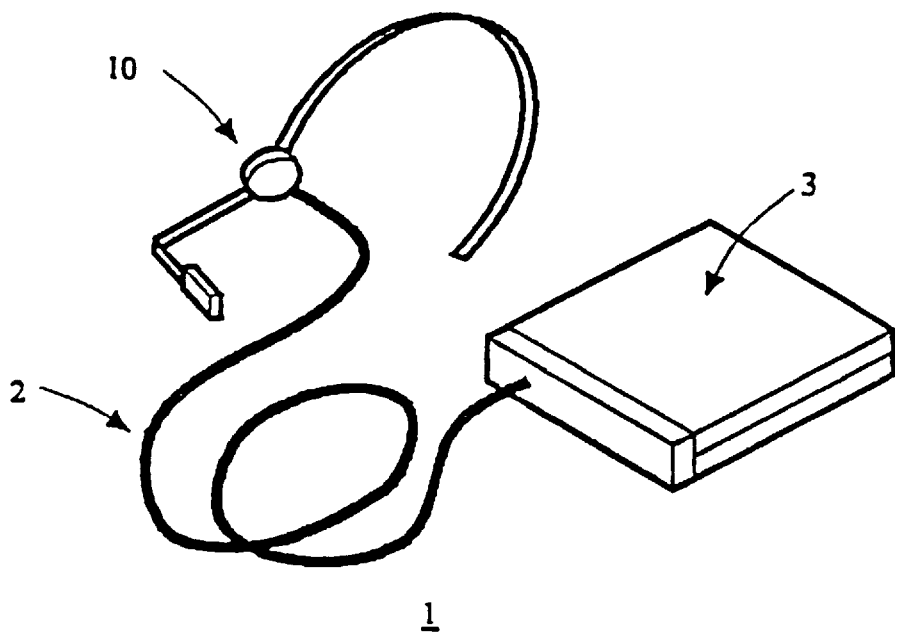
FIG. 1 illustrates a wearable computer to which a cable and heat sink according to a preferred embodiment of the invention is applied.

Referring now to the drawings, and more particularly to FIGS. 1–7, there is shown a preferred embodiment of the structure according to the present invention.

FIG. 1 shows a wearable computer 1 to which a cable and heat sink according to the present invention are applied. As shown in FIG. 1, the wearable computer 1 includes a headmount display 10, a cable 2, and the PC body 3 of the wearable computer.

In the wearable computer 1, the cable 2 according to the present invention connects the PC body 3 and the headmount display 10 mounted on, for example, a user's head. The cable transmits operating power and image signals from the PC body 3 to the headmount display 10 while conducting heat generated by a CPU inside the PC body 3 to the exterior of the PC body 3. Thus, the cable radiates heat from the interior of the PC body 3.

In addition to transmitting signals and power, the cable 2 can be configured as a loss prevention member (e.g., without providing power or signal lines) that simply connects the headmount display 10 and the PC body 3 together. In a specific example in which the cable 2 is configured as a signal cable as described above, a configuration of cable 2 is described with reference to FIGS. 2 and 3.

Figure 2:
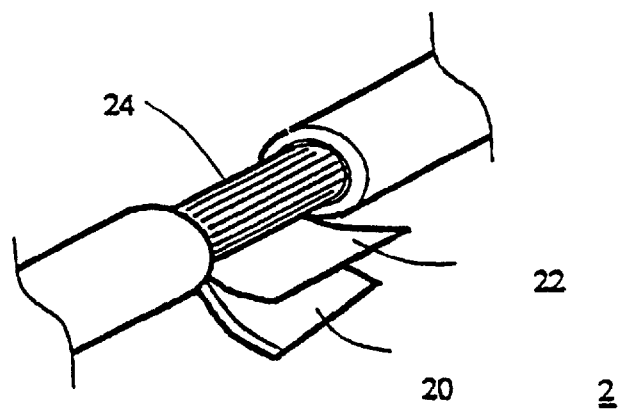
FIG. 2 illustrates a configuration of the cable shown in FIG. 1.
Figure 3:
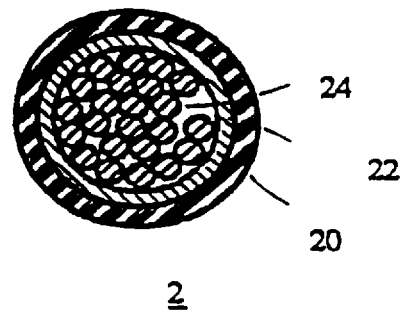
FIG. 3 is a sectional view of the cable shown in FIGS. 1 and 2.

FIG. 2 shows a detailed section of the cable 2 shown in FIG. 1. FIG. 3 is a cross-sectional view of the cable 2 shown in FIGS. 1 and 2.

As shown in FIGS. 2 and 3, the cable 2 extends in a longitudinal direction and includes conductors 24 transmitting operating power and image signals from the PC body 3 to the headmount display 10, a heat conducting sheet 22 provided along the conductors 24 so as to cover their circumference, and a coating 20 provided to cover the conductors 24 and the heat conducting sheet 22 to protect the interior of the cable 2. The cable 2 is configured to have the heat conducting sheet 22 between the conductors 24 and a coating 20 of a normal signal cable.

The heat conducting sheet 22 is preferably formed of a material having high heat conductivity and flexibility (e.g., for example, "Panasonic Graphite Sheet" produced by Matsushita Electric Industrial Co., Ltd.). The heat conducting sheet 22 conducts heat generated by the CPU 30 inside the PC body 3 in the longitudinal direction of the cable 2, while gradually releasing the heat from the surface of the cable 2 in order to radiate it from the PC body 3.

The heat conducting sheet 22 preferably has high conductivity, high flexibility, and high durability. Of these properties, high heat conductivity is required to radiate heat from the PC body 3.

In addition, due to the connection between the PC body 3 and the headmount display 10, the usability of the wearable computer 1 may be degraded if the cable 2 lacks flexibility. Thus, for similar reasons, the heat conducting sheet 22 also must be very flexible. Also, the heat conducting sheet 22 is repeatedly folded prior to use, so it must equal or exceed the durability of the other components of the cable 2 (e.g., signal lines 24 and the coating 20).

Figure 4:
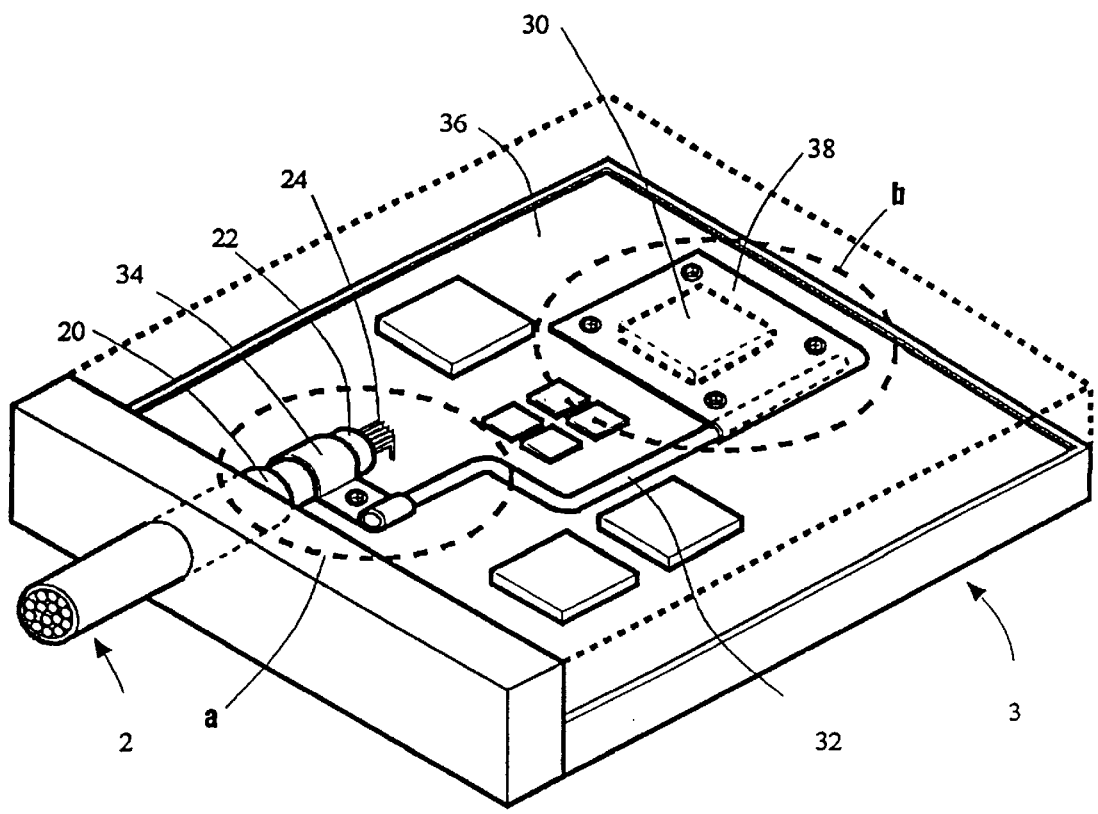
FIG. 4 illustrates a connection between a personal computer (PC) body and a cable.
Figure 5:
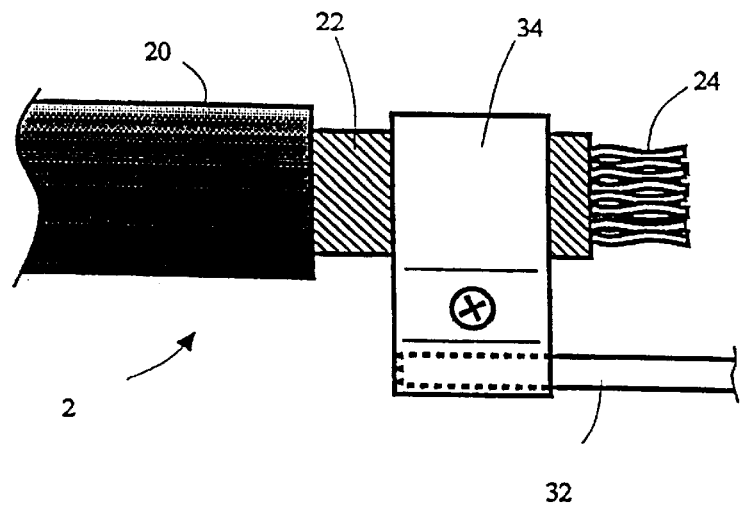
FIG. 5 illustrates a connection between the cable and a connection member, which is shown by a dashed circle (a) in FIG. 4.
Figure 6:
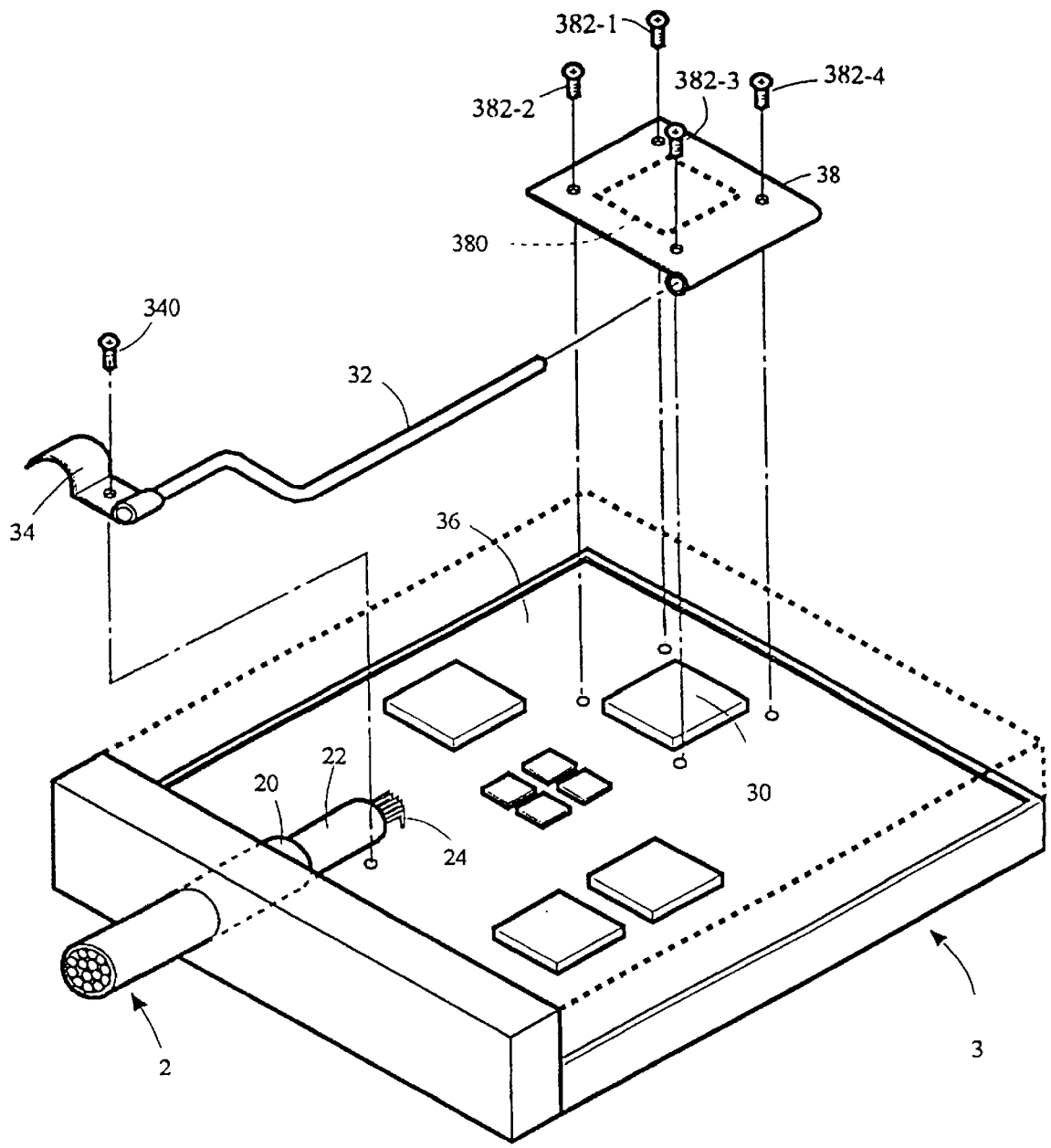
FIG. 6 illustrates a connection between a CPU and a heat collecting member.

The connection between the cable 2 and the CPU 30 in the PC body 3 is described below with reference to FIGS. 4–6. FIG. 4 shows a connection between the PC body 3 and the cable 2. FIG. 5 shows a connection between the cable 2 and a connection member 34, which is outlined by dashed circle a in FIG. 4. FIG. 6 shows a connection between the CPU 30 and a heat collecting member 38, which is outlined by dashed circle b in FIG. 4. As shown in FIGS. 4–6, the CPU 30 and other PC parts are located on a card 36 inside the PC body 3.

As shown in FIGS. 4 and 6, the cable 2 extends from the exterior to the interior of the PC body 3, and a coating 20 at the end of the cable 2 in the interior of the PC is removed to draw out the heat conducting sheet 22 and the conductors 24 as required. The conductors 24 are connected to relevant portions of the card 36.

As shown in FIGS. 5 and 6, the heat conducting sheet 22 and the conductors 24 are attached to the card 36 together with the connection member 34 and one end of a heat pipe 32 using a screw or the like. Thus, the heat conducting sheet 22, the connection member 34, and the heat pipe 32 are thermally connected together.

As shown in FIG. 6, a heat conducting pad 380 is provided on a side of the heat collecting member 38. When the heat collecting member 38 is mounted on the card 36 using four screws 382-1 to 382-4, the heat conducting pad 380 is pressed against the top surface of the CPU 30.

In this manner, the heat collecting member 38 and the CPU 30 are thermally connected via the heat conducting pad 380. The other end of the heat pipe 32 is guided into a slot on the card 36 and locked to the heat collecting member 38 for caulking and thermal connection. That is, the CPU 30 and the heat conducting sheet 22 of the cable 2 are thermally connected via the heat collecting member 38, the heat pipe 32, and the connection member 34.

Figure 7:
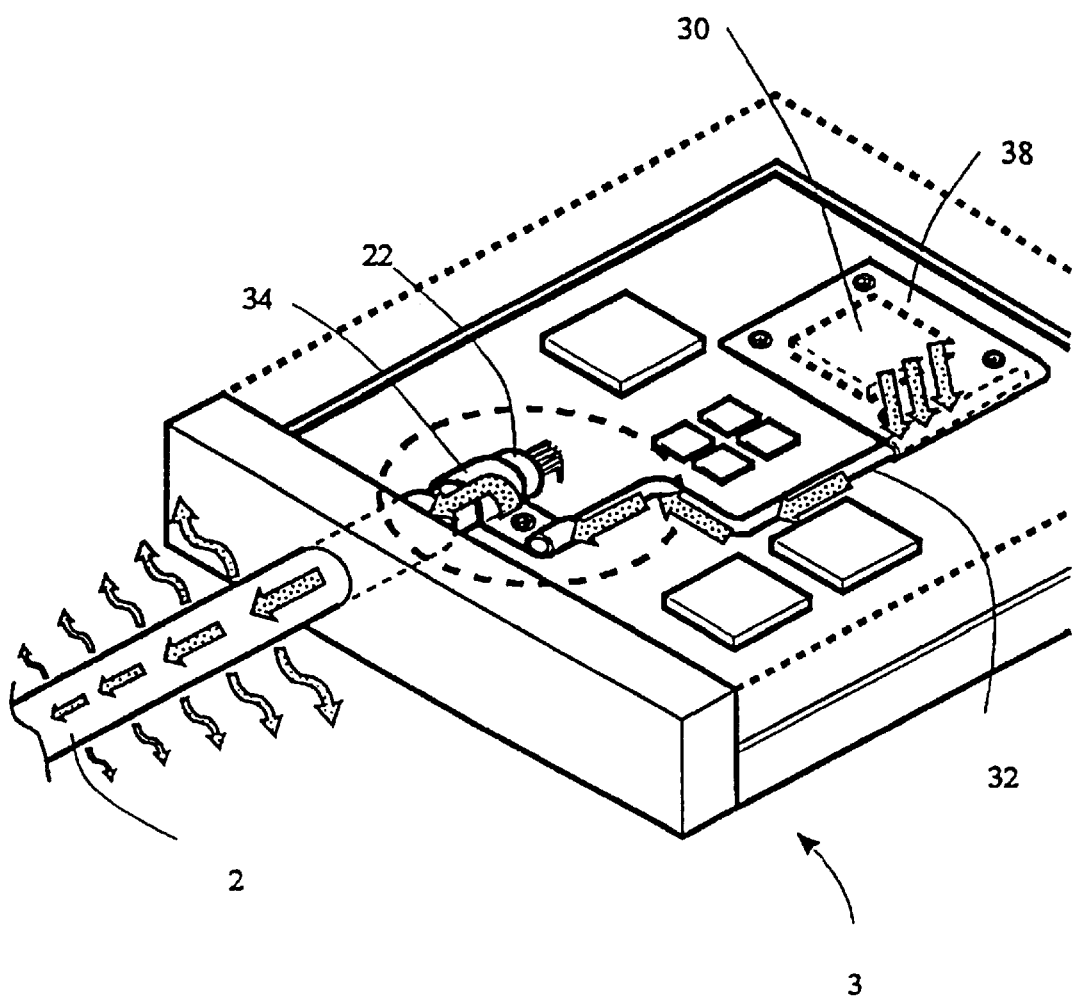
FIG. 7 illustrates heat radiation performed by the cable according to the invention.

FIG. 7 shows heat radiation provided by the cable 2 according to the present invention. As shown by the arrows in FIG. 7, heat generated by the CPU 30 inside the PC body 3 is transferred to the heat collecting member 38 and then to the heat conducting sheet 22 of the cable 2 via the heat pipe 32 and the connection member 34.

The heat conducting sheet 22 conducts in a longitudinal direction of the cable 2, the heat transferred via the heat collecting member 38, the heat pipe 32, and the connection member 34, and gradually releases the heat to the exterior via the coating 20, to radiate the heat from the interior of the PC body 3.

The exemplary material described above for the heat conducting sheet 22 may be replaced by another suitable material having similar heat conductivity and flexibility properties, depending on the application. Instead of graphite, the heat conducting sheet may be a material including a metal having a high heat conductivity (e.g., copper or the like) which has been shaped into a sheet or a line.

In addition, the method for connecting the CPU 30 and the heat conducting sheet 22 as shown in FIG. 4 is only an example, and a different connection method providing similar heat conduction can be used depending on the application.

As described above, the cable according to the present invention can conduct heat, generated in a device connected thereto, to the exterior for heat radiation. In addition, the heat sink according to the present invention can use the cable connected to a device for which a radiating device cannot be provided easily, to conduct heat generated inside this device to the exterior for heat radiation.

Further, the cable and heat sink according to the present invention are suitable for heat radiation from the interior of a portable computer such as a wearable computer by using a cable connecting the body of the portable computer and a display device and to which a heat conducting member is added.

While the invention has been described in terms of a preferred embodiment, those skilled in the art will recognize that the invention can be practiced with modification within the spirit and scope of the appended claims.

What is claimed is:

1. A cable for radiating heat, comprising:
   a heat conducting and radiating member for conducting heat in a longitudinal direction of said cable and radiating conducted heat,
   wherein a durability of said heat conducting and radiating member equals or exceeds a durability of other cable components,
   wherein said cable is permanently attached in a direct connection to an electronic device, and
   wherein heat conduction occurs via the cable while the cable is transported.

2. The cable according to claim 1, further comprising:
   a plurality of conductors extending in the longitudinal direction of said cable,
   wherein said heat conducting and radiating member extends in the longitudinal direction of said cable and is disposed along said conductors.

3. The cable according to claim 2, wherein said plurality of conductors comprise a transmission line for transmitting at least one of signals and power.

4. A portable device, comprising:
   the cable of claim 1.

5. The portable device, as claimed in claim 4, further comprising:
   a plurality of conductors extending in the longitudinal direction of said cable,
   wherein said heat conducting and radiating member extends in the longitudinal direction of said cable and is disposed along said conductors.

6. The portable device, as claimed in claim 5, wherein said plurality of conductors comprise a transmission line for transmitting at least one of signals and power.

7. A wearable computer comprising:
   the cable of claim 1.

8. The wearable computer according to claim 7, wherein heat conduction occurs via the cable while the wearable computer is worn.

9. The cable for radiating heat, as claimed in claim 1, wherein said heat conducting and radiating member is thermally connected to said electronic device by at least one of a heat connecting member, a heat pipe, and a heat collecting member.

10. A cable for radiating heat, comprising:
    a plurality of conductors extending in a longitudinal direction of said cable;
    a heat conducting and radiating member covering a circumference of said conductors to conduct heat in a longitudinal direction of said cable and to radiate conducted heat; and
    a coating covering the circumference of said heat conducting and radiating member,
    wherein a durability of said heat conducting and radiating member equals or exceeds a durability of other cable components,
    wherein said cable is permanently attached in a direct connection to an electronic device, and
    wherein heat conduction occurs via the cable while the cable is transported.

11. A portable device comprising:
    the cable of claim 10.

12. The portable device according to claim 11, wherein heat conduction occurs via the cable while the portable device is transported.

13. A wearable computer comprising:
    the cable of claim 10.

14. The wearable computer according to claim 13, wherein heat conduction occurs via the cable while the wearable computer is worn.

15. A heat sink comprising:
    a cable for radiating heat; and
    a heat connecting member for thermally connecting a heat generator to said cable,
    wherein said cable comprises a heat conducting and radiating member for conducting heat in a longitudinal direction of said cable and radiating conducted heat,
    wherein a durability of said heat conducting and radiating member equals or exceeds a durability of other cable components,
    wherein said cable is permanently attached in a direct connection to an electronic device, and
    wherein heat conduction occurs via the cable while the cable is transported.

16. The heat sink according to claim 15, wherein said cable comprises:
    a plurality of conductors extending in a longitudinal direction of said cable;
    a heat conducting and radiating member covering a circumference of said conductors to conduct heat in the longitudinal direction of said cable and to radiate conducted heat; and
    a coating covering a circumference of said heat conducting and radiating member.

17. The heat sink according to claim 15, wherein a heat connecting member conducts heat from said heat generator to said heat conducting and radiating member of said cable.

18. The heat sink according to claim 15, further comprising:

a conductor extending in the longitudinal direction of said cable, wherein said heat conducting and radiating member extends in the longitudinal direction of said cable and is disposed along said conductor.

19. The heat sink according to claim 18, wherein said conductor comprises a transmission line for transmitting at least one of signals and power.

20. A portable device comprising:

the cable of claim 15.

21. The portable device according to claim 20, wherein heat conduction occurs via the cable while the portable device is transported.

22. A wearable computer comprising:

the cable of claim 15.

23. The wearable computer, according to claim 22, wherein said cable comprises:

a plurality of conductors extending in a longitudinal direction of said cable;

a heat conducting and radiating member covering a circumference of said conductors to conduct heat in the longitudinal direction of said cable and to radiate the conducted heat; and a coating covering a circumference of said heat conducting and radiating member.

24. The wearable computer according to claim 22, wherein said cable comprises:

a heat conducting and radiating member for conducting heat in a longitudinal direction of said cable and radiating the conducted heat.

25. The wearable computer according to claim 22, wherein heat conduction occurs via the cable while the wearable computer is worn.

26. The heat sink, as claimed in claim 15, wherein said heat connecting member comprises a heat pipe.

* * * * *